(12) United States Patent
Sawaki et al.

(10) Patent No.: US 11,195,983 B2
(45) Date of Patent: Dec. 7, 2021

(54) PIEZOELECTRIC FILM, PIEZOELECTRIC ELEMENT, AND METHOD FOR MANUFACTURING PIEZOELECTRIC FILM

(71) Applicant: FUJIFILM Corporation, Tokyo (JP)

(72) Inventors: Daigo Sawaki, Kanagawa (JP); Naoki Murakami, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 629 days.

(21) Appl. No.: 16/199,296

(22) Filed: Nov. 26, 2018

(65) Prior Publication Data

US 2019/0097121 A1 Mar. 28, 2019

Related U.S. Application Data

(63) Continuation of application No. PCT/JP2017/026547, filed on Jul. 21, 2017.

(30) Foreign Application Priority Data

Jul. 28, 2016 (JP) .............................. JP2016-148051

(51) Int. Cl.
*H01L 41/18* (2006.01)
*H01L 41/08* (2006.01)
(Continued)

(52) U.S. Cl.
CPC .......... *H01L 41/0805* (2013.01); *C01G 33/00* (2013.01); *C23C 14/08* (2013.01);
(Continued)

(58) Field of Classification Search
CPC ............... H01L 41/187; H01L 41/1876; H01L 41/0805; H01L 41/047; H01L 41/09;
(Continued)

(56) References Cited

U.S. PATENT DOCUMENTS

2008/0231667 A1 9/2008 Arakawa et al.
2009/0230346 A1 9/2009 Hamada et al.
(Continued)

FOREIGN PATENT DOCUMENTS

DE 112017000678 B4 6/2020
JP 2008-266770 A 11/2008
(Continued)

OTHER PUBLICATIONS

International Search Report issued in PCT/JP2017/026547; dated Oct. 10, 2017.
(Continued)

*Primary Examiner* — J. San Martin
(74) *Attorney, Agent, or Firm* — Studebaker & Brackett PC (57) ABSTRACT

Provided is a piezoelectric film that has a perovskite structure preferentially oriented to a (100) plane and that comprises a composite oxide represented by the following compositional formula: $Pb_a[(Zr_xTi_{1-x})_{1-y}Nb_y]_bO_3$ wherein $0<x<1$, and $0.10\le y<0.13$, in which in a case where a ratio $I_{(200)}/I_{(100)}$ of a diffraction peak intensity $I_{(200)}$ from a perovskite (200) plane with respect to a diffraction peak intensity $I_{(100)}$ from a perovskite (100) plane, as measured by an X-ray diffraction method, is r, and a/b is q, $0.28r+0.9\le q\le 0.32r+0.95$, $1.10\le q\le 1.25$, and $r\le 1.00$ are satisfied.

6 Claims, 3 Drawing Sheets

(51) Int. Cl.
*H01L 41/316* (2013.01)
*C23C 14/08* (2006.01)
*C01G 33/00* (2006.01)
*H01L 41/09* (2006.01)
*H01L 41/187* (2006.01)
*H01L 41/047* (2006.01)
*H01L 41/314* (2013.01)

(52) U.S. Cl.
CPC ............ *H01L 41/047* (2013.01); *H01L 41/09* (2013.01); *H01L 41/187* (2013.01); *H01L 41/1876* (2013.01); *H01L 41/314* (2013.01); *H01L 41/316* (2013.01)

(58) Field of Classification Search
CPC ..... H01L 41/314; H01L 41/316; C01G 33/00; C23C 14/08
See application file for complete search history.

(56) References Cited

U.S. PATENT DOCUMENTS

| | | |
|---|---|---|
| 2010/0079552 A1 | 4/2010 | Arakawa et al. |
| 2010/0194824 A1 | 8/2010 | Arakawa et al. |
| 2011/0316393 A1 | 12/2011 | Naono et al. |
| 2017/0256700 A1 | 9/2017 | Murakami |
| 2018/0351075 A1 | 12/2018 | Sawaki et al. |

FOREIGN PATENT DOCUMENTS

| | | | |
|---|---|---|---|
| JP | 2010-077011 A | 4/2010 | |
| JP | 2010-080813 A | 4/2010 | |
| JP | 2010-182717 A | 8/2010 | |
| JP | 2012-009677 A | 1/2012 | |
| JP | 2016-103567 A | 6/2016 | |
| WO | WO-2017135166 A1 * | 8/2017 | ......... H01L 41/0477 |

OTHER PUBLICATIONS

Written Opinion issued in PCT/JP2017/026547; dated Oct. 10, 2017.
International Preliminary Report on Patentability issued in PCT/JP2017/026547; completed Jul. 12, 2018.
An Office Action mailed by the German Patent and Trade Mark Office dated Jun. 9, 2020, which corresponds to German Patent Application No. DE 112017003091.9.

* cited by examiner

PIEZOELECTRIC FILM, PIEZOELECTRIC ELEMENT, AND METHOD FOR MANUFACTURING PIEZOELECTRIC FILM

CROSS-REFERENCE TO RELATED APPLICATIONS

This application is a continuation application of International Application No. PCT/JP2017/026547, filed Jul. 21, 2017, the disclosure of which is incorporated herein by reference in its entirety. Further, this application claims priority from Japanese Patent Application No. 2016-148051, filed Jul. 28, 2016, the disclosure of which is incorporated herein by reference in its entirety.

BACKGROUND OF THE INVENTION

1. Field of the Invention

The present invention relates to a lead zirconate titanate (PZT)-based piezoelectric film and a method for manufacturing the same, and a piezoelectric element.

2. Description of the Related Art

As an actuator, there is known a piezoelectric element in which a piezoelectric film having a piezoelectric effect which is displaced by applying a voltage and an electrode for applying a voltage to the piezoelectric film are combined. Since the piezoelectric film is a thin film and is advantageous for miniaturization, the piezoelectric film is extremely useful. However, there is a problem that sufficient device performance cannot be exhibited because piezoelectric performance is poor.

As piezoelectric materials for a piezoelectric film, PZT, and a substitution system of PZT in which part of an A site and/or B site of PZT is substituted by another element have been known. It is known that in PZT to which a donor ion having a valence higher than the valence of a substitutable ion is added, piezoelectric performance is further improved than that of the intrinsic PZT. In the present specification, PZT and a substitution system thereof are collectively referred to as "PZT system".

For example, JP2012-009677A discloses a piezoelectric film capable of obtaining sufficient piezoelectric performance by incorporating 13% or more of Nb, and setting a diffraction peak intensity ratio from a (100) plane and a (200) plane to a predetermined value or greater.

In addition, JP2010-182717A proposes a piezoelectric film attaining both good piezoelectric performance and durability, which is formed of a perovskite type oxide represented by $Pb_a(Zr_x,Ti_y,M_{b-x-y})_bO_c$ . . . (P), has a perovskite single phase structure not including a pyrochlore phase, and satisfies $a/b \leq 1.06$.

SUMMARY OF THE INVENTION

However, although it is considered that the leakage current of the piezoelectric film disclosed in JP2012-009677A or JP2010-182717A is small at room temperature and the durability is also sufficient, it has been found by the investigation of the present inventors that there is a problem that the leakage current increases at a high temperature of 100° C. or higher and in a high electric field region of 20 V or higher.

The present invention is made in consideration of the above circumstances and an object thereof is to provide a piezoelectric film capable of suppressing an increase in leakage current occurring at the time of driving at high temperature and in a high electric field region, and a piezoelectric element. Another object of the present invention is to provide a method for manufacturing a piezoelectric film capable of suppressing an increase in leakage current occurring at the time of driving at high temperature and in a high electric field region.

According to the present invention, there is provided a piezoelectric film that has a perovskite structure preferentially oriented to a (100) plane and that comprises a composite oxide represented by the following compositional formula:

$$Pb_a[(Zr_xTi_{1-x})_{1-y}Nb_y]_bO_3$$

wherein $0<x<1$, and $0.10 \leq y < 0.13$, and in which in a case where a ratio $I_{(200)}/I_{(100)}$ of a diffraction peak intensity $I_{(200)}$ from a perovskite (200) plane with respect to a diffraction peak intensity $I_{(100)}$ from a perovskite (100) plane, as measured by an X-ray diffraction method, is r, and a/b is q, the following relationships are satisfied:

$$0.28r+0.9 \leq q \leq 0.32r+0.95,$$

$$1.10 \leq q, \text{ and}$$

$$r \leq 1.00.$$

In the piezoelectric film of the present invention, it is preferable that r satisfies the following relationship: $0.6 \leq r \leq 0.9$.

In the piezoelectric film of the present invention, it is preferable that q satisfies the following relationship: $1.12 \leq q \leq 1.21$.

A piezoelectric element according to the present invention is a piezoelectric element comprising: the piezoelectric film of the present invention; and an electrode adapted apply an electric field to the piezoelectric film.

A method for manufacturing the piezoelectric film according to the present invention comprises, as steps for forming a piezoelectric film on a substrate using a sputtering method: an initial step of forming a film to a film thickness of 5% or less of a total film thickness; and a latter step of forming the entire piezoelectric film, successively to the initial step, in which relationships between a film formation temperature T1 and a film formation rate R1 in the initial step and a film formation temperature T2 and a film formation rate R2 in the latter step, satisfy the following relationships:

$$1.02 \leq T1/T2 \leq 1.06,$$

$$1.00 \leq R1/R2 \leq 1.54,$$

$$500° C. \leq T1 \leq 600° C., \text{ and}$$

$$1.8 \text{ nm/sec} \leq R1 \leq 3.0 \text{ nm/sec}.$$

The piezoelectric film of the present invention has a perovskite structure preferentially oriented to a (100) plane, satisfies the above-mentioned conditions, is capable of suppressing the generation of a leakage current at the time of driving at high temperature and in a high electric field, and exhibits very high durability.

DESCRIPTION OF THE PREFERRED EMBODIMENTS

Hereinafter, embodiments of a piezoelectric film, a piezoelectric element, and a method for manufacturing a piezoelectric film according to the present invention will be described with reference to the drawings.

[Piezoelectric Film]

A piezoelectric film according to an embodiment of the present invention has a perovskite structure preferentially oriented to a (100) plane and is a composite oxide represented by a compositional formula $Pb_a[(Zr_xTi_{1-x})_{1-y}Nb_y]_bO_c$, where $0<x<1$, and $0.10 \leq y<0.13$.

In the piezoelectric film according to the embodiment of the present invention, in a case where a ratio $I_{(200)}/I_{(100)}$ of a diffraction peak intensity $I_{(200)}$ from a perovskite (200) plane with respect to a diffraction peak intensity $I_{(100)}$ from a perovskite (100) plane, as measured by an X-ray diffraction method, is r, and a ratio of Pb, which is an A site element, with respect to B site elements $Pb/(Zr+Ti+Nb)=a/b$ is q, the following relationships are satisfied.

$$0.28r+0.9 \leq q \leq 0.32r+0.95$$

$$1.10 \leq q, \text{ and } r \leq 1.00$$

Herein, the ideal compositional ratio of the perovskite structure is a:b:c=1:1:3, but in the present invention, a:b:c is represented by q:1:c, and c may be deviated from 3 as long as q satisfies the above range and a perovskite structure can be formed.

The (r,q) values satisfying the above conditions are in a range indicated by diagonal lines in FIG. 4 which will be described later.

It is preferable that r is in a range of $0.6 \leq r \leq 0.9$.

In addition, it is preferable that q is in a range of $1.12 \leq q \leq 1.21$.

Figure 1:
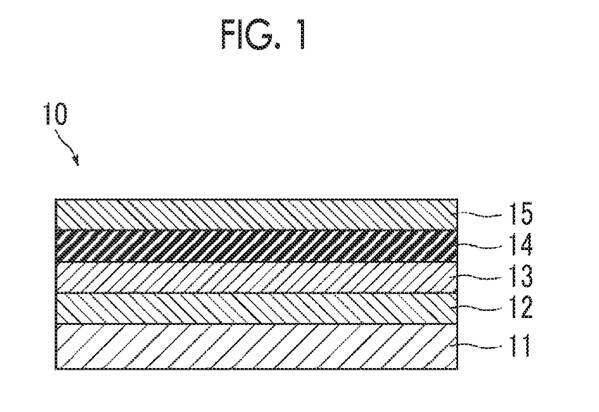
FIG. 1 is a schematic cross-sectional view showing an embodiment of a piezoelectric element of the present invention.

The piezoelectric film 14 has a perovskite structure preferentially oriented to a (100) plane. Herein, the preferential orientation refers to a state in which a specific crystal surface is arranged in a substantially constant direction rather than the orientation direction of crystals being disordered. Specifically, the expression "preferentially oriented to a (100) plane" means that a diffraction intensity ratio of a (100) plane, a (110) plane, and a (111) plane (100)/((100)+(110)+(111)) obtained in a case where the piezoelectric film is measured by an X-ray diffraction wide angle method is more than 0.5.

By setting the content (y) of Nb to 0.10 (10% by percentage) or more, piezoelectric characteristics can be improved. In addition, by setting the content of Nb to less than 0.13 (13% by percentage), the content of Pb is increased and thus an increase in a leakage current can be suppressed.

In addition, by setting the peak intensity ratio within the above range, an oxygen defect in the piezoelectric film can be suppressed and a leakage current can be suppressed.

Although the detailed mechanism by which the leakage current increases due to driving at high temperature and in a high electric field has not been clarified, the present inventors have assumed that this is because oxygen defects are generated due to Pb deficiency at the A site in the crystal structure and divalent Pb is substituted at the B site to compensate charge neutrality, so that a defect level is formed in the band gap. It has been assumed that since this defect level corresponds to a deep level near the valence band, the leakage current is generated at high temperature and in a high electric field region.

It has been found by the investigation of the present inventors that in a case where the piezoelectric film satisfies the above conditions, the leakage current is not significantly increased after driving at a high temperature of 100° C. or higher and in a high electric field of 20 V or higher, and driving can be performed with the leakage current which is not significantly changed compared to the leakage current before driving at high temperature and in a high electric field (refer to examples below). The piezoelectric film satisfying the above conditions is assumed to exhibit high resistance to driving at high temperature and in a high electric field since Pb is fully incorporated in the crystal lattice in a stable state. In a case where the content of Nb is 13% or more, it is assumed that the amount of Pb to be incorporated in the lattice is reduced and the instability of Pb at high temperature is generated.

The film thickness of the piezoelectric film is preferably 1.5 μm or more. The piezoelectric film having the thick film thickness can be formed by a gas phase growth method which will be described later.

[Piezoelectric Element]

FIG. 1 is a schematic cross-sectional view showing an embodiment of a piezoelectric element of the present invention.

A piezoelectric element 10 is an element in which an adhesion layer 12, a lower electrode layer 13, a piezoelectric film 14, and an upper electrode layer 15 are sequentially laminated on a surface of a substrate 11, and in the piezoelectric film 14, an electric field is applied in a film thickness direction by the lower electrode layer 13 and the upper electrode layer 15.

The piezoelectric film 14 is the piezoelectric film of the above embodiment according to the present invention.

In the piezoelectric element 10 of the embodiment, the substrate 11 is not particularly limited and substrates of silicon, glass, stainless steel, yttrium stabilized zirconia (YSZ), $SrTiO_3$, alumina, sapphire, silicon carbide, and the like may be used. As the substrate 11, a laminated substrate such as a SOI substrate in which a $SiO_2$ film and a Si active layer are sequentially laminated on a silicon substrate, or the like may be used. In the embodiment, the adhesion layer 12 for improving the adhesiveness between the substrate and the lower electrode layer is comprised between the substrate 11 and the lower electrode layer 13. However, a buffer layer for improving lattice matching properties may be comprised instead of or in addition to the adhesion layer.

For the adhesion layer 12, a configuration using Ti, TiW, or the like is preferable and an aspect in which a platinum group metal is laminated on the adhesion layer to form a layer is more preferable.

The lower electrode layer 13 is an electrode for applying a voltage to the piezoelectric film. The main component of the lower electrode layer 13 is not particularly limited and metals such as Au, Pt, Ir, $IrO_2$, $RuO_2$, $LaNiO_3$, $SrRuO_3$, indium tin oxide (ITO), and titanium nitride (TiN), metal oxides, transparent conductive materials, and a combination thereof may be used. For the lower electrode layer 13, it is particularly preferable to use Ir.

The upper electrode layer 15 forms a pair with the lower electrode layer 13 and is an electrode for applying a voltage to the piezoelectric film. The main component of the upper electrode layer 15 is not particularly limited and materials exemplified as materials for the lower electrode layer 13, electrode materials that generally used in a semiconductor process, such as Al, Ta, Cr, Cu, Ir, and Pt, and a combination thereof may be used.

The thickness of the lower electrode layer 13 and the upper electrode layer 15 is not particularly limited and is preferably 50 to 500 nm.

[Method for Forming Piezoelectric Film]

A method for forming the piezoelectric film 14 is not particularly limited and a gas phase growth method such as a sputtering method, a plasma chemical vapor deposition (CVD) method, a metal organic chemical vapor deposition (MOCVD) method, or a pulse laser deposition (PLD) method, a liquid phase method such as a sol-gel method, or an organic metal decomposition method, and an aerosol deposition method may be used. Since film formation conditions during film formation are easily changed, a gas phase growth method is preferable. In addition, by forming a film by a gas phase growth method, horizontal stripe generation during film formation can be suppressed and a piezoelectric film having high durability can be formed.

The manufacturing of the piezoelectric film by a gas phase growth method can be applied to a film formation apparatus in which a substrate and a target are placed to face each other, and a film including a target constitutional element is formed on the substrate using a plasma. Examples of applicable film formation methods include sputtering methods such as a bipolar sputtering method, a tripolar sputtering method, a direct current sputtering method, a high frequency sputtering method (RF sputtering method), an ECR sputtering method, a magnetron sputtering method, an opposed target sputtering method, a pulsed sputtering method, and an ion beam sputtering method. Further, examples of gas phase growth methods to which the present invention can be applied, apart from the sputtering methods, include an ion plating method, and a plasma CVD method.

In the manufacturing of the piezoelectric film according to the embodiment of the present invention, particularly, a high frequency sputtering method (RF sputtering method) is preferably used.

An embodiment of the method for manufacturing a piezoelectric film using a sputtering method will be described.

In the manufacturing step of the piezoelectric film, the film formation conditions are changed by an initial step of forming a film up to a film thickness of 5% or less of a target total film thickness and a latter step of forming the film up to the total film thickness successively to the initial step.

In this case, relationships between a film formation temperature T1 and a film formation rate R1 in the initial step and a film formation temperature T2 and a film formation rate R2 in the latter step satisfy $1.02 \leq T1/T2 \leq 1.06$, and $1.00 \leq R1/R2 \leq 1.54$.

The present inventors have found that by forming the film under the above conditions, it is possible to obtain a piezoelectric film which has a perovskite structure preferentially oriented to a (100) plane and is a composite oxide represented by a compositional formula $Pb_a[(Zr_xTi_{1-x})_{1-y}Nb_y]_bO_3$, where $0<x<1$, $0.10 \leq y < 0.13$, in which in a case where a ratio $I_{(200)}/I_{(100)}$ of a diffraction peak intensity $I_{(200)}$ from a perovskite (200) plane with respect to a diffraction peak intensity $I_{(100)}$ from a perovskite (100) plane, as measured by an X-ray diffraction method, is r, and a/b is q, $0.28r+0.9 \leq q \leq 0.32r+0.95$ and $1.10 \leq q$, and $r \leq 1.00$ are satisfied. Herein, the film formation temperature means the substrate temperature.

It is preferable that the initial film formation temperature T1 in the initial step is set to 500° C. to 600° C. and the initial film formation rate R1 is in a range of 1.8 nm/sec to 3.0 nm/sec.

The initial step is a period in which a film is formed to have a predetermined film thickness of 5% or less of the total film thickness. In the initial step, a film is formed to have a film thickness which is 5% or less of the total film thickness and is at least 100 nm or more. Accordingly, the period of the initial step may be appropriately set in a range in which the piezoelectric film can be formed to have a predetermined film thickness which is 100 nm or more and 5% or less of the total film thickness.

By forming the film under the above conditions, it is possible to manufacture the piezoelectric film according to the embodiment of the present invention capable of suppressing an increase in leakage current even after driving at high temperature and in a high electric field.

Figure 2:
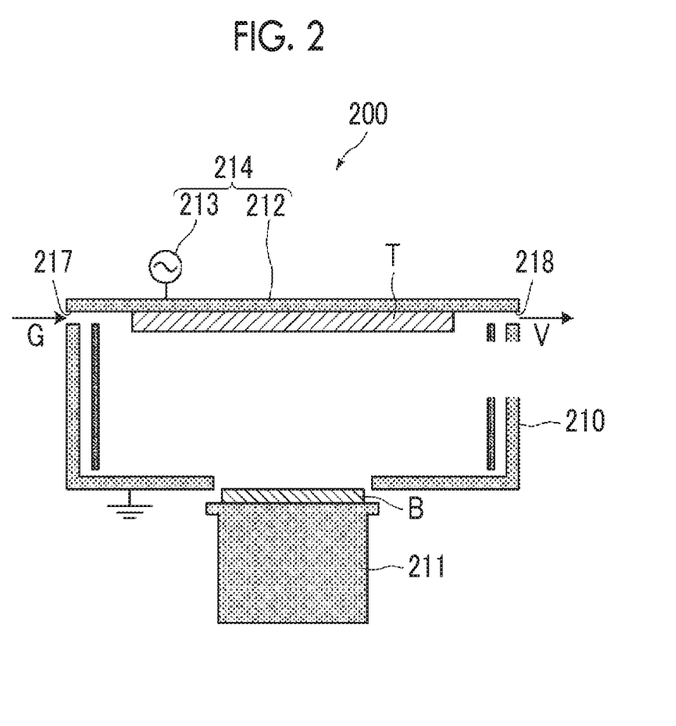
FIG. 2 is a view showing an example of a manufacturing apparatus for manufacturing a piezoelectric film of the present invention.

FIG. 2 is a view showing an example of a manufacturing apparatus for manufacturing the piezoelectric film according to an embodiment of the present invention. In a film formation apparatus (high frequency sputtering apparatus) 200 shown in FIG. 2, a substrate B can be mounted. The film formation apparatus is schematically configured to have a vacuum vessel 210 comprising a substrate holder 211 capable of heating the mounted substrate B to a predetermined temperature, and a target holder 212 on which a target T can be mounted. In the apparatus shown in FIG. 2, the vacuum vessel 210 functions as a film formation chamber.

In the vacuum vessel 210, the substrate holder 211 and the target holder 212 are separately arranged to face each other. The target holder 212 is connected to a radio frequency power supply (RF power supply) 213 arranged on the outside of the vacuum vessel 210, and the target holder 212 functions as a plasma power supply (cathode electrode) for generating plasma. In FIG. 2, as plasma generating means 214 for generating plasma in the vacuum vessel 210, the radio frequency power supply 213 and the target holder 212 which functions as a cathode electrode are comprised.

The substrate B is not particularly limited and can be appropriately selected from a Si substrate, an oxide substrate, a glass substrate, a quartz substrate, and the like according to application. The composition of a target T is selected according to the composition of a film to be formed.

The film formation apparatus 200 comprises gas introduction means 217 for introducing a gas G which is changed into plasma in the vacuum vessel 210, and a gas discharge pipe 218 which performs ventilation V of gas in the vacuum vessel 210. As the gas G, Ar, an Ar/O$_2$ mixed gas, or the like may be used.

In FIG. 2, the wall surface of the vacuum vessel 210 is provided as a floating wall 220 and the potential of the wall surface is set at a floating potential. Since the wall surface has the same potential as a plasma potential by setting the potential of the wall surface to a floating potential, the plasma component does not easily reach the wall surface of the vacuum vessel 210 and thus the ion collision energy to the substrate B can be increased. Accordingly, Pb ions can be arranged on the A site of the perovskite structure (ABO$_3$) and the amount of unstable Pb ions in the crystal can be reduced. Thus, high piezoelectric performance can be obtained in the formed piezoelectric film.

In FIG. 2, the ion collision energy to the substrate B is increased by setting the potential of the wall surface of the vacuum vessel 210 to a floating potential. However, as another method, the ion collision energy can be controlled by reducing an anode area in the vacuum vessel 210, or by changing the impedance of the substrate B to be covered with an insulator. The film formation rate can be changed by adjusting power applied at the time of film formation.

EXAMPLES

Next, the present invention will be more specifically described using examples. However, the present invention is not limited to these examples.

Example 1

Using a sputtering apparatus on which a 300 mmφ target was mounted, as shown in FIG. 2, the potential of a film formation chamber side wall surface was set to a floating potential. A LCR (L (inductance), C (capacitance), R (resistance)) circuit having variable impedance was connected to a substrate, and the impedance of the substrate was changed. Thus, $V_{sub}$ (the potential of the substrate during film formation) during film formation could be changed.

As a target, $Pb_{1.3}(Zr_{0.47}Ti_{0.43}Nb_{0.10})O_x$ was used to prepare a thin PZT film having a thickness of 2.0 μm (piezoelectric film). The film formation gas was a mixed gas of 99.5% of Ar and 0.5% of $O_2$. Under the film formation conditions that the ratio between the initial film formation temperature and the latter film formation temperature was set to 1.04, and the ratio between the initial film formation rate and the latter film formation rate was set to 1.43, a piezoelectric film of Example 1 was formed. The initial film formation temperature T1 was set to 570° C., and the initial film formation rate R1 was set to 2.0 mm/sec. The details of the film formation conditions are collectively shown in Table 1.

Example 2

A piezoelectric film of Example 2 was formed in the same manner as in Example 1 except that the film formation conditions that the ratio between the initial film formation temperature and the latter film formation temperature was set to 1.06, and the ratio between the initial film formation rate and the latter film formation rate was set to 1.33 were set were set.

Example 3

A piezoelectric film of Example 3 was formed in the same manner as in Example 1 except that the film formation conditions that the ratio between the initial film formation temperature and the latter film formation temperature was set to 1.06, and the ratio between the initial film formation rate and the latter film formation rate was set to 1.00 were set.

Example 4

A piezoelectric film of Example 4 was formed in the same manner as in Example 1 except that the film formation conditions that the ratio between the initial film formation temperature and the latter film formation temperature was set to 1.02, and the ratio between the initial film formation rate and the latter film formation rate was set to 1.43 were set.

Example 5

As a target, $Pb_{1.3}(Zr_{0.46}Ti_{0.42}Nb_{0.12})O_x$ was used to form a piezoelectric film of Example 5 under the film formation conditions that the ratio between the initial film formation temperature and the latter film formation temperature was set to 1.06, and the ratio between the initial film formation rate and the latter film formation rate was set to 1.54.

Example 6

A piezoelectric film of Example 6 was formed in the same manner as in Example 5 except that the film formation conditions that the ratio between the initial film formation temperature and the latter film formation temperature was set to 1.04, and the ratio between the initial film formation rate and the latter film formation rate was set to 1.33 were set.

Example 7

A piezoelectric film of Example 7 was formed in the same manner as in Example 5 except that the film formation condition that the ratio between the initial film formation rate and the latter film formation rate was set to 1.00 was set.

Example 8

A piezoelectric film of Example 8 was formed in the same manner as in Example 5 except that the film formation conditions that the ratio between the initial film formation temperature and the latter film formation temperature was set to 1.02, and the ratio between the initial film formation rate and the latter film formation rate was set to 1.00 were set, and the initial film formation temperature was set to 500° C.

Example 9

A piezoelectric film of Example 9 was formed in the same manner as in Example 5 except that the film formation conditions that the ratio between the initial film formation temperature and the latter film formation temperature was set to 1.02, and the ratio between the initial film formation rate and the latter film formation rate was set to 1.00 were set, and the initial film formation temperature was set to 600° C.

Example 10

A piezoelectric film of Example 10 was formed in the same manner as in Example 5 except that the initial film formation rate was set to 1.5 nm/sec, and the film formation condition that the ratio between the initial film formation rate and the latter film formation rate was set to 1.20 was set.

Example 11

A piezoelectric film of Example 11 was formed in the same manner as in Example 5 except that the initial film formation rate was set to 3.0 nm/sec and the film formation condition that the ratio between the initial film formation rate and the latter film formation rate was set to 1.07 was set.

Comparative Example 1

A piezoelectric film of Comparative Example 1 was formed in the same manner as in Example 1 except that as a target, $Pb_{1.3}(Zr_{0.47}Ti_{0.43}Nb_{0.10})O_x$ was used, and the film formation conditions that the ratio between the initial film formation temperature and the latter film formation temperature was set to 1.06, and the ratio between the initial film formation rate and the latter film formation rate was set to 0.80 were set.

Comparative Example 2

A piezoelectric film of Comparative Example 2 was formed in the same manner as in Comparative Example 1 except that the film formation conditions that the ratio between the initial film formation temperature and the latter film formation temperature was set to 1.06, and the ratio between the initial film formation rate and the latter film formation rate was set to 2.00 were set.

Comparative Example 3

A piezoelectric film of Comparative Example 3 was formed in the same manner as in Comparative Example 1 except that as a target, $Pb_{1.3}(Zr_{0.46}Ti_{0.42}Nb_{0.12})O_x$ was used and the film formation conditions that the ratio between the initial film formation temperature and the latter film formation temperature was set to 1.04, and the ratio between the initial film formation rate and the latter film formation rate was set to 0.80 were set.

Comparative Example 4

A piezoelectric film of Comparative Example 4 was formed in the same manner as in Comparative Example 3 except that the film formation conditions that the ratio between the initial film formation temperature and the latter film formation temperature was set to 1.06, and the ratio between the initial film formation rate and the latter film formation rate was set to 2.00 were set.

Comparative Example 5

A piezoelectric film of Comparative Example 5 was formed in the same manner as in Comparative Example 1 except that as a target, $Pb_{1.3}(Zr_{0.47}Ti_{0.44}Nb_{0.09})O_x$ was used and the film formation conditions that the ratio between the initial film formation temperature and the latter film formation temperature was set to 1.04, and the ratio between the initial film formation rate and the latter film formation rate was set to 1.00 were set.

Comparative Example 6

A piezoelectric film of Comparative Example 6 was formed in the same manner as in Comparative Example 1 except that as a target, $Pb_{1.3}(Zr_{0.45}Ti_{0.42}Nb_{0.13})O_x$ was used and the film formation conditions that the ratio between the initial film formation temperature and the latter film formation temperature was set to 1.06, and the ratio between the initial film formation rate and the latter film formation rate was set to 1.00 were set.

Comparative Example 7

A piezoelectric film of Comparative Example 7 was formed in the same manner as in Comparative Example 6 except that the film formation conditions that the ratio between the initial film formation temperature and the latter film formation temperature was set to 1.00, and the ratio between the initial film formation rate and the latter film formation rate was set to 1.00 were set.

[Measurement Method]

<Intensity Ratio $I_{(200)}/I_{(100)}$>

In each of Examples and Comparative Examples above, an XRD diffraction pattern was obtained and a peak intensity ratio $I_{(200)}/I_{(100)}$ (=q) between the perovskite (100) plane and (200) plane was obtained.

Figure 3:
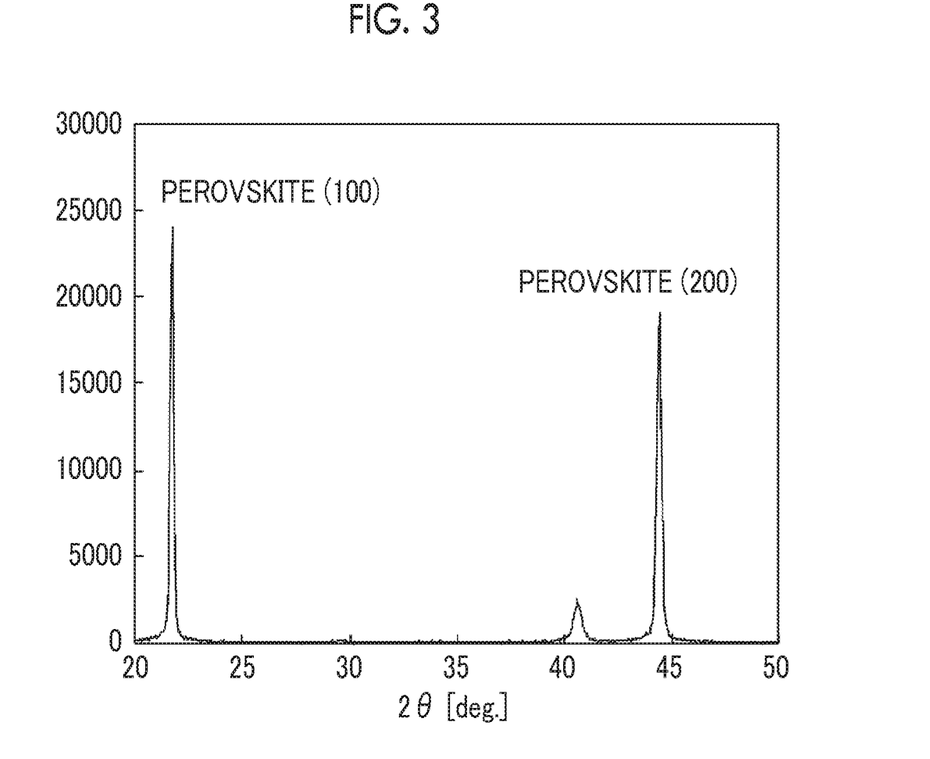
FIG. 3 is a graph showing an XRD spectrum of a piezoelectric element of an example.

All of Examples and Comparative Examples had a (100) single orientation. FIG. 3 shows an XRD diffraction pattern of the piezoelectric film of Example 2 as an example.

<Pb/(Zr+Ti+Nb)>

Using an energy-dispersive x-ray spectroscopy (EDX) type X-ray fluorescence (XRF) apparatus, the composition analysis was performed and the compositional ratio of Pb, Zr, Ti, and Nb was obtained to calculate Pb/(Zr+Ti+Nb)=a/b(=q). Nb/(Zr+Ti+Nb) was obtained by the composition analysis to calculate the content of Nb.

[Leakage Current Measurement Method]

The substrate on which the piezoelectric film was formed was set on a hot plate and a prober was set to the upper electrode and the lower electrode. The hot plate was heated to a predetermined temperature and the leakage current at the time when a predetermined voltage was applied was measured.

The leakage current before driving at high temperature was the amount of leakage current measured at the time when a voltage was applied under the following driving condition at room temperature. On the other hand, the leakage current during driving at high temperature was obtained by measuring the amount of leakage current at the time when a voltage was applied at 250° C. under the following driving condition.

Driving condition: $1.0 \times 10^5$ V/cm

The film formation conditions and measurement results of each of Examples and Comparative Examples are collectively shown in Table 1.

TABLE 1

| | Content of Nb [%] | Initial film formation temperature T1 [°C.] | Latter film formation temperature T2 [°C.] | Temperature ratio T1/T2 | Initial film formation rate R1 [nm/sec] | Latter film formation rate R2 [nm/sec] | Rate ratio R1/R2 | Leakage current before driving at high temperature [A/cm²] | Leakage current at time of driving at high temperature [A/cm²] | $I_{(200)}/I_{(100)}$ (= r) | Pb/(Zr + Ti + Nb) (= q) |
|---|---|---|---|---|---|---|---|---|---|---|---|
| Example 1 | 10 | 570 | 550 | 1.04 | 2.0 | 1.4 | 1.43 | $8.7 \times 10^{-8}$ | $8.7 \times 10^{-8}$ | 0.70 | 1.15 |
| Example 2 | 10 | 570 | 540 | 1.06 | 2.0 | 1.5 | 1.33 | $6.7 \times 10^{-8}$ | $7.7 \times 10^{-8}$ | 0.80 | 1.16 |
| Example 3 | 10 | 570 | 540 | 1.06 | 2.0 | 2.0 | 1.00 | $6.9 \times 10^{-8}$ | $7.2 \times 10^{-8}$ | 0.80 | 1.12 |
| Example 4 | 10 | 570 | 560 | 1.02 | 2.0 | 1.4 | 1.43 | $8.8 \times 10^{-8}$ | $9.0 \times 10^{-8}$ | 0.60 | 1.14 |
| Example 5 | 12 | 570 | 540 | 1.06 | 2.0 | 1.3 | 1.54 | $9.1 \times 10^{-8}$ | $9.4 \times 10^{-8}$ | 0.80 | 1.21 |
| Example 6 | 12 | 570 | 550 | 1.04 | 2.0 | 1.5 | 1.33 | $7.3 \times 10^{-8}$ | $7.6 \times 10^{-8}$ | 0.70 | 1.12 |
| Example 7 | 12 | 570 | 540 | 1.06 | 2.0 | 2.0 | 1.00 | $8.3 \times 10^{-8}$ | $8.6 \times 10^{-8}$ | 0.90 | 1.19 |
| Example 8 | 12 | 500 | 490 | 1.02 | 2.0 | 2.0 | 1.00 | $8.5 \times 10^{-8}$ | $8.6 \times 10^{-8}$ | 0.95 | 1.20 |
| Example 9 | 12 | 600 | 590 | 1.02 | 2.0 | 2.0 | 1.00 | $8.7 \times 10^{-8}$ | $8.8 \times 10^{-8}$ | 0.80 | 1.12 |
| Example 10 | 12 | 570 | 540 | 1.06 | 1.8 | 1.5 | 1.20 | $8.7 \times 10^{-8}$ | $8.8 \times 10^{-8}$ | 0.90 | 1.19 |
| Example 11 | 12 | 570 | 540 | 1.06 | 3.0 | 2.8 | 1.07 | $8.3 \times 10^{-8}$ | $8.5 \times 10^{-8}$ | 0.90 | 1.15 |
| Comparative Example 1 | 10 | 570 | 540 | 1.06 | 2.0 | 2.5 | 0.80 | $6.3 \times 10^{-8}$ | $6.3 \times 10^{-5}$ | 0.80 | 1.07 |
| Comparative Example 2 | 10 | 570 | 540 | 1.06 | 2.0 | 1.0 | 2.00 | $8.7 \times 10^{-8}$ | $3.6 \times 10^{-5}$ | 1.10 | 1.36 |
| Comparative Example 3 | 12 | 570 | 550 | 1.04 | 2.0 | 2.5 | 0.80 | $8.6 \times 10^{-8}$ | $4.7 \times 10^{-4}$ | 0.70 | 1.05 |
| Comparative Example 4 | 12 | 570 | 540 | 1.06 | 2.0 | 1.0 | 2.00 | $7.7 \times 10^{-8}$ | $6.3 \times 10^{-4}$ | 1.20 | 1.40 |
| Comparative Example 5 | 9 | 570 | 550 | 1.04 | 2.0 | 2.0 | 1.00 | $6.7 \times 10^{-8}$ | $6.2 \times 10^{-5}$ | 0.65 | 1.02 |
| Comparative Example 6 | 13 | 570 | 540 | 1.06 | 2.0 | 2.0 | 1.00 | $7.6 \times 10^{-8}$ | $5.4 \times 10^{-4}$ | 0.85 | 1.08 |
| Comparative Example 7 | 13 | 570 | 570 | 1.00 | 2.0 | 2.0 | 1.00 | $6.6 \times 10^{-8}$ | $4.4 \times 10^{-4}$ | 0.75 | 1.06 |

As shown in Table 1, in Examples 1 to 11, the leakage current after driving at high temperature was not significantly changed compared to the leakage current before driving at high temperature. That is, a change in the leakage current before and after driving at high temperature was less than one digit. On the other hand, in Comparative Examples 1 to 7, the leakage current after driving at high temperature was increased by three digits or more from the leakage current before driving at high temperature.

In Examples 1 to 11 satisfying the conditions of the present invention, it was confirmed that a change in the leakage current before and after driving at high temperature was small and the durability was very excellent.

Figure 4:
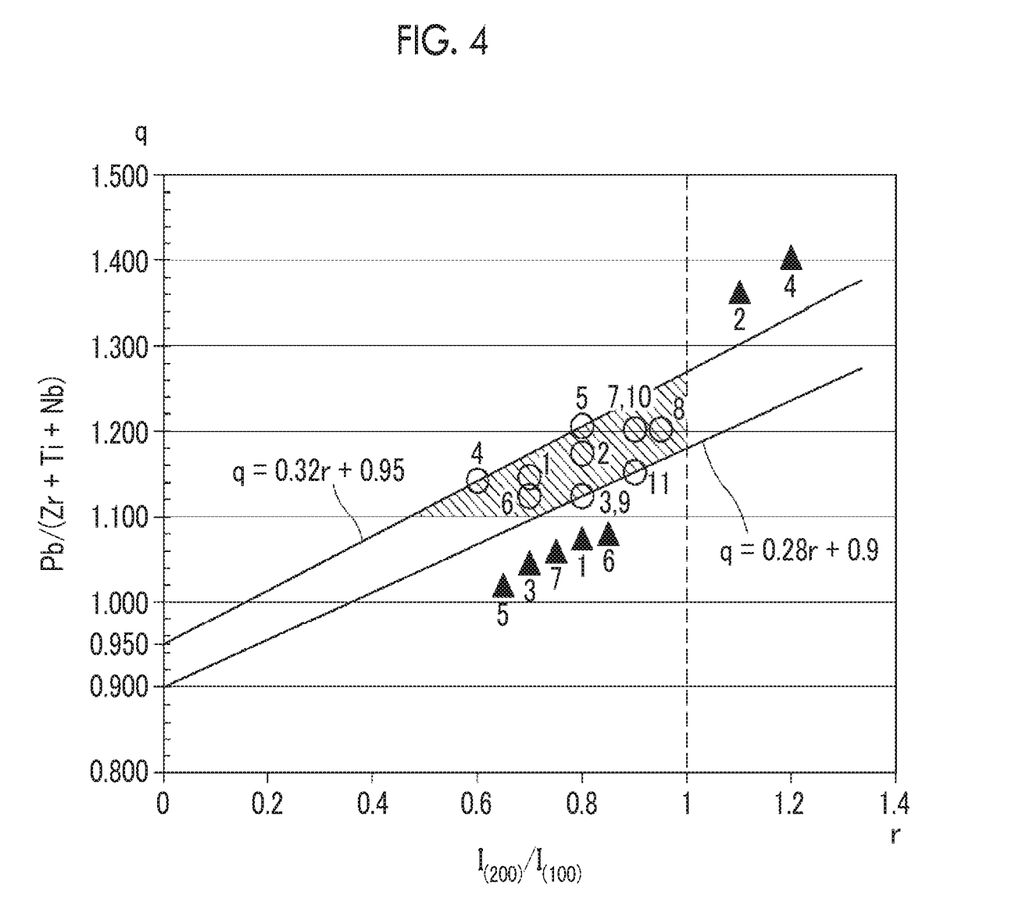
FIG. 4 is a graph in which r and q values of Examples and Comparative Examples are plotted.

FIG. 4 is a diagram in which (r,q) values of each of Examples and Comparative Examples are plotted in a graph of a horizontal axis r and a vertical axis q. Examples are shown by white circles (○) and Comparative Examples are shown by black triangles (▲). The each given numeral indicates the number of each of Examples and Comparative Examples.

As shown in FIG. 4, it was found that Examples 1 to 11 were included in the oblique region surrounded by q=0.32r+0.95, q=0.28r+0.9, q=1.10, and r=1.

That is, it was found that, in the composite oxide represented by the compositional formula $Pb_a[(Zr_xTi_{1-x})_{1-y}Nb_y]_bO_3$, where 0<x<1 and 0.10≤y<0.13, in a case where the ratio $I_{(200)}/I_{(100)}$ of a diffraction peak intensity $I_{(200)}$ from a perovskite (200) plane with respect to a diffraction peak intensity $I_{(100)}$ rom a perovskite (100) plane, as measured by an X-ray diffraction method, was r, and a/b was q, as long as r and q were in a range satisfying $$0.28r+0.9 \leq q \leq 0.32r+0.95, 1.10 \leq q, \text{ and } r \leq 1.0,$$

a piezoelectric film capable of suppressing an increase in the leakage current before and after driving at high temperature was obtained.

The piezoelectric film according to the embodiment of the present invention can be preferably used for an ink jet recording head, a magnetic recording and reproducing head, a MEMS device, a micropump, a piezoelectric actuator mounted in an ultrasound probe or the like, and a ferroelectric element such as a ferroelectric memory.

EXPLANATION OF REFERENCES

10: piezoelectric element
11: substrate
12: adhesion layer
13: lower electrode layer
14: piezoelectric film
15: upper electrode layer
200: film formation apparatus (high frequency sputtering apparatus)
210: vacuum vessel
211: substrate holder
212: target holder
213: radio frequency power supply (RF power supply)
217: gas introduction means
218: gas discharge pipe
220: floating wall
B: substrate
G: gas
T: target
V: ventilation

What is claimed is:

1. A piezoelectric film that has a perovskite structure preferentially oriented to a (100) plane and that comprises a composite oxide represented by the following compositional formula:

$$Pb_a[(Zr_xTi_{1-x})_{1-y}Nb_y]_bO_3$$

wherein 0<x<1, and 0.10≤y<0.13, and wherein, in a case where a ratio $I_{(200)}/I_{(100)}$ of a diffraction peak intensity $I_{(200)}$ from a perovskite (200) plane with respect to a diffraction peak intensity $I_{(100)}$ from a perovskite (100) plane, as measured by an X-ray diffraction method, is r, and a/b is q, the following relationships are satisfied:

$0.28r+0.9 \leq q \leq 0.32r+0.95$, $1.10 \leq q$, and $r \leq 1.00$.

2. The piezoelectric film according to claim 1, wherein r satisfies the following relationship:

$0.6 \leq r \leq 0.9$.

3. The piezoelectric film according to claim 1, wherein q satisfies the following relationship:

$1.12 \leq q \leq 1.21$.

4. The piezoelectric film according to claim 2, wherein q satisfies the following relationship:

$1.12 \leq q \leq 1.21$.

5. A piezoelectric element, comprising:
   the piezoelectric film according to claim 1; and
   an electrode adapted to apply an electric field to the piezoelectric film.

6. A method for manufacturing the piezoelectric film according to claim 1 comprising, as steps for forming a piezoelectric film on a substrate using a sputtering method:
   an initial step of forming a film to a film thickness of 5% or less of a total film thickness; and
   a latter step of forming the entire piezoelectric film, successively to the initial step,
   wherein relationships between a film formation temperature T1 and a film formation rate R1 in the initial step, and a film formation temperature T2 and a film formation rate R2 in the latter step, satisfy the following relationships:

$1.02 \leq T1/T2 \leq 1.06$, $1.00 \leq R1/R2 \leq 1.54$, $500° C. \leq T1 \leq 600° C.$, and $1.8 \text{ nm/sec} \leq R1 \leq 3.0 \text{ nm/sec}$.

* * * * *